United States Patent
Katsura et al.

(10) Patent No.: US 9,817,311 B2
(45) Date of Patent: *Nov. 14, 2017

(54) RESIST PATTERN-FORMING METHOD, SUBSTRATE-PROCESSING METHOD, AND PHOTORESIST COMPOSITION

(71) Applicant: JSR CORPORATION, Tokyo (JP)

(72) Inventors: Yuichiro Katsura, Tokyo (JP); Ryu Matsumoto, Tokyo (JP); Motoyuki Shima, Tokyo (JP); Yuji Yada, Tokyo (JP); Ken Nakakura, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/164,047

(22) Filed: May 25, 2016

(65) Prior Publication Data

US 2016/0266489 A1    Sep. 15, 2016

Related U.S. Application Data

(63) Continuation of application No. 14/457,724, filed on Aug. 12, 2014, now Pat. No. 9,417,527.

(30) Foreign Application Priority Data

Aug. 13, 2013    (JP) .................................. 2013-168410
Jul. 14, 2014    (JP) .................................. 2014-144601

(51) Int. Cl.
| | |
|---|---|
| G03F 7/039 | (2006.01) |
| G03F 7/26 | (2006.01) |
| G03F 7/20 | (2006.01) |
| G03F 7/004 | (2006.01) |
| G03F 7/16 | (2006.01) |

(52) U.S. Cl.
CPC .......... *G03F 7/0392* (2013.01); *G03F 7/0045* (2013.01); *G03F 7/20* (2013.01); *G03F 7/26* (2013.01); *G03F 7/162* (2013.01)

(58) Field of Classification Search
CPC ............................. G03F 7/0392; G03F 7/0045
See application file for complete search history.

(56) References Cited

U.S. PATENT DOCUMENTS

| | | | |
|---|---|---|---|
| 4,491,628 | A | 1/1985 | Ito et al. |
| 5,576,143 | A | 11/1996 | Aoai |
| 5,976,759 | A | 11/1999 | Urano et al. |
| 6,303,268 | B1 | 10/2001 | Namba |
| 2002/0076649 | A1 | 6/2002 | Kumon et al. |
| 2003/0003391 | A1 | 1/2003 | Barclay et al. |
| 2003/0027086 | A1 | 2/2003 | Thackeray et al. |
| 2005/0186500 | A1 | 8/2005 | Voigt et al. |
| 2009/0081589 | A1 | 3/2009 | Toukhy et al. |
| 2013/0026044 | A1 | 1/2013 | Yasuda et al. |
| 2013/0129988 | A1 | 5/2013 | Yasuda et al. |
| 2014/0255833 | A1 | 9/2014 | Yasuda et al. |

FOREIGN PATENT DOCUMENTS

| | | |
|---|---|---|
| EP | 2551722 A1 | 1/2013 |
| JP | 59-45439 | 3/1984 |
| JP | 5-188598 | 7/1993 |
| JP | H10-048826 A | 2/1998 |
| JP | 2002-169288 A | 6/2002 |
| JP | 2011-003722 A | 1/2011 |
| JP | 2012-181488 A | 9/2012 |
| JP | 2013-047786 A | 3/2013 |
| JP | 2013-109012 A | 6/2013 |

OTHER PUBLICATIONS

Office Action issued Sep. 19, 2017 in Japanese Patent Application No. 2014-144601 (w/ Computer-generated English translation).

*Primary Examiner* — Cynthia Hamilton
(74) *Attorney, Agent, or Firm* — Oblon, McClelland, Maier & Neustadt, L.L.P.

(57) ABSTRACT

A resist pattern-forming method is provided, including: providing a resist film using a photoresist composition; exposing the resist film; and developing the resist film exposed, the photoresist composition containing a polymer having a weight average molecular weight of no less than 1,000 and no greater than 7,500 and having a structural unit that includes an acid-labile group that is dissociated by an action of an acid, a radiation-sensitive acid generator and a solvent composition, and the photoresist composition having a content of solids of no less than 20% by mass and no greater than 60% by mass. The photoresist composition preferably has a viscosity of no less than 50 mPa·s and no greater than 150 mPa·s at 25° C.

13 Claims, No Drawings

RESIST PATTERN-FORMING METHOD, SUBSTRATE-PROCESSING METHOD, AND PHOTORESIST COMPOSITION

CROSS-REFERENCE TO RELATED APPLICATIONS

The present application is a continuation application of U.S. patent application Ser. No. 14/457,724, filed on Aug. 12, 2014, which claims priority to Japanese Patent Application No. 2014-144601, filed on Jul. 14, 2014, and to Japanese Patent Application No. 2013-168410, filed on Aug. 13, 2013. The contents of these applications are incorporated herein by reference in their entirety.

DISCUSSION OF THE BACKGROUND

The present invention relates to a resist pattern-forming method, a substrate-processing method, and a photoresist composition.

Background Art

Chemically amplified photoresist compositions generate an acid upon irradiation with e.g., far ultraviolet light typified by a KrF excimer laser beam or an ArF excimer laser beam at a light-exposed site, and a reaction that proceeds with an aid of the acid as a catalyst allows the difference in dissolution rates in developing solutions to be produced between the light-exposed site and the light-unexposed site, thereby enabling resist patterns to be formed on a substrate (see Japanese Unexamined Patent Application, Publication No. S59-45439).

Semiconductor devices are manufactured by subjecting a silicon wafer to etching processing using as a mask, the resist pattern formed in this manner. In recent years, two-dimensional microfabrication of the semiconductor devices is reaching its limit, and thus memories having a three-dimensional structure have been developed by manufacturers of semiconductors.

By way of one example of methods for processing a device to form a three-dimensional structure as mentioned above, a method is known including a plurality of etching steps of etching a substrate using a resist pattern as a mask, then slimming the resist pattern by a treatment such as etching to obtain a desired pattern configuration, and further etching the substrate. In such a processing method of a device having a three-dimensional structure, characteristics required for photoresist compositions include a potentiality for attaining an increased film thickness while maintaining resist performances such as resolving ability, a roughness performance and etching resistance.

However, when a viscosity is increased in order to attain the increased film thickness, a rate of filtration and/or a trapping efficiency of unwanted substances in a production process of photoresist compositions are decreased, leading to a decrease of the productivity. In addition, it is highly likely that a necessary flow rate cannot be ensured by a pump within a preexisting resist application apparatus and furthermore defects such as occurrence of foaming are generated. In the foregoing circumstances, a photoresist composition has been desired which is applicable to preexisting application apparatuses without decreasing productivity thereof, while maintaining resist performances, and enables a resist film having an increased film thickness to be uniformly formed.

PRIOR ART DOCUMENTS

Patent Documents

Patent Document 1: Japanese Unexamined Patent Application, Publication No. S59-45439

SUMMARY OF THE INVENTION

The present invention was made in view of the foregoing circumstances, and it is an object of the present invention to provide a resist pattern-forming method, a substrate-processing method and a photoresist composition that enable resist performances to be improved, are applicable to preexisting application apparatuses without decreasing productivity thereof, and enable a resist pattern having an increased film thickness to be formed.

DESCRIPTION OF THE EMBODIMENTS

According to an aspect of the invention made for solving the aforementioned problems, a resist pattern-forming method is provided, including: providing a resist film using a photoresist composition; exposing the resist film; and developing the resist film exposed, the photoresist composition containing: a polymer having a weight average molecular weight of no less than 1,000 and no greater than 7,500 and having a structural unit that includes an acid-labile group that is dissociated by an action of an acid (hereinafter, may be also referred to as "(A) polymer" or "polymer (A)"); a radiation-sensitive acid generator (hereinafter, may be also referred to as "(B) acid generator" or "acid generator (B)"); and a solvent composition (hereinafter, may be also referred to as "(C) solvent composition" or "solvent composition (C)"), and the photoresist composition having a content of solids of no less than 20% by mass and no greater than 60% by mass.

According to the resist pattern-forming method, when the photoresist composition is used which contains the polymer having a weight average molecular weight falling within the specific range and having a structural unit that includes an acid-labile group that is dissociated by an action of an acid (hereinafter, may be also referred to as "structural unit (I)"), and has a content of solids falling within the specific range, a resist pattern having an increased film thickness can be formed using a preexisting application apparatus without decreasing productivity thereof. In addition, when the polymer having a weight average molecular weight falling within the specific range and having the structural unit (I) that includes an acid-labile group is used, the functions as a chemically amplified resist can be exhibited, and enhanced sensitivity of the resist in the exposure step and a favorable pattern configuration owing to favorable resolving ability can be attained, resulting in an improvement of the resist performances.

The photoresist composition preferably has a viscosity of no less than 50 mPa·s and no greater than 150 mPa·s at 25° C. When the photoresist composition has a viscosity falling within the specific range, a further decrease of the rate of filtration and/or the trapping efficiency of unwanted substances can be inhibited in the production process; moreover, when the photoresist composition is used with a conventional application apparatus for resist compositions for an excimer laser, a necessary flow rate can be ensured more reliably, and the occurrence of foaming is decreased to a greater extent. In addition, when the photoresist composition has a viscosity falling within the specific range, a more uniform coating film can be formed.

It is preferred that the polymer further has a structural unit represented by the following formula (1-1) (hereinafter, may be also referred to as "structural unit (II)"). When the polymer has the specific structural unit, an affinity to an alkaline developer solution can be improved, and as a result, resist performances of the photoresist composition can be enhanced. It is to be noted that the structural unit (II) does not contain the acid-labile group that is dissociated by an action of an acid.

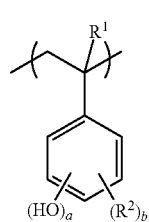

(1-1)

In the formula (1-1), $R^1$ represents a hydrogen atom or an alkyl group having 1 to 5 carbon atoms; $R^2$ represents a substituted or unsubstituted alkyl group having 1 to 12 carbon atoms, a substituted or unsubstituted alkoxy group having 1 to 12 carbon atoms, or a substituted or unsubstituted monovalent aromatic hydrocarbon group having 6 to 12 carbon atoms; a is an integer of 1 to 3; and b is an integer of 0 to 3, wherein a sum of a and b is no greater than 5, and wherein in a case where b is no less than 2, a plurality of $R^2$s are identical or different.

The proportion of the structural unit (II) with respect to the total structural units constituting the polymer (A) is preferably no less than 20 mol % and no greater than 90 mol %. When the proportion of the structural unit (II) falls within the specific range, the polymer (A) located at a light-exposed site can be sufficiently dissolved in a developer solution, leading to a favorable configuration of the resist pattern.

The film thickness of the resist film in the resist film-providing step is preferably no less than 2 μm and no greater than 20 μm. When the film thickness of the resist film falls within the specific range, a resist pattern can be formed more easily and favorably.

The radioactive ray used in the exposure step is preferably a KrF excimer laser beam. When the exposure is carried out by way of a KrF excimer laser beam, a resist pattern can be further easily and favorably formed.

The solvent composition may contain a first solvent having a viscosity of no greater than 1.5 mPa·s at 20° C. (hereinafter, may be also referred to as "(C1) solvent" or "solvent (C1)"). In this instance, the content of the solvent (C1) in the total solvent composition is preferably no less than 60% by mass. When the specific solvent is contained at the specific content, the viscosity of the photoresist composition can be decreased, and the productivity in the production and/or the ease of handling in the coating thereof can be improved.

According to another aspect of the invention made for solving the aforementioned problems, a substrate-processing method is provided, including: providing a resist film on a substrate using a photoresist composition; exposing the resist film; developing the resist film exposed to form a resist pattern; etching the substrate using the resist pattern as a mask; baring a part of an upper face of the substrate by etching the resist pattern after the etching of the substrate; and thereafter repeating the etching of the substrate and the baring at least once in this order, the photoresist composition containing: a polymer having a weight average molecular weight of no less than 1,000 and no greater than 7,500 and having a structural unit that includes an acid-labile group that is dissociated by an action of an acid; a radiation-sensitive acid generator; and a solvent composition, and the photoresist composition having a content of solids of no less than 20% by mass and no greater than 60% by mass.

According to the substrate-processing method, since the photoresist composition is used, the substrate can be easily and favorably processed to form a three-dimensional structure.

The photoresist composition preferably has a viscosity of no less than 50 mPa·s and no greater than 150 mPa·s at 25° C. When the photoresist composition has a viscosity falling within the specific range, the substrate can be more easily and favorably processed to form a three-dimensional structure.

It is preferred that the polymer further has the structural unit (II). When the polymer has the specific structural unit, the substrate can be further easily and favorably processed to form a three-dimensional structure.

The proportion of the structural unit (II) with respect to the total structural units constituting the polymer (A) is preferably no less than 20 mol % and no greater than 90 mol %. When the proportion of the structural unit (II) falls within the specific range, the substrate can be further easily and favorably processed to form a three-dimensional structure.

The film thickness of the resist film in the providing a resist film on a substrate is preferably no less than 2 μm and no greater than 20 μm. When the film thickness of the resist film falls within the specific range, the substrate can be further easily and favorably processed to form a three-dimensional structure.

The radioactive ray used in the exposing the resist film is preferably a KrF excimer laser beam. When the exposure is carried out by way of a KrF excimer laser beam, the substrate can be further easily and favorably processed to form a three-dimensional structure.

According to still another aspect of the invention made for solving the aforementioned problems, a photoresist composition is provided, containing: a polymer having a structural unit that includes an acid-labile group that is dissociated by an action of an acid; a radiation-sensitive acid generator; and a solvent composition, the polymer having a weight average molecular weight of no less than 1,000 and no greater than 7,500, the structural unit being represented by the following formula (1-2) or the following formula (1-4), and the photoresist composition having a content of solids of no less than 20% by mass and no greater than 60% by mass.

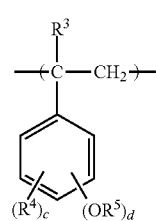

(1-2)

In the formula (1-2), $R^3$ represents a hydrogen atom or a methyl group; $R^4$ represents a monovalent organic group that does not include an acid-labile group; c is an integer of 0 to 3, wherein in case where c is no less than 2, a plurality of $R^4$s are identical or different; $R^5$ represents a monovalent acid-labile group; and d is an integer of 1 to 3, wherein in a case where d is no less than 2, a plurality of $R^5$s are identical or different, and wherein a sum of c and d is no greater than 5.

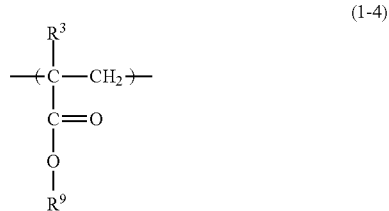

(1-4)

In the formula (1-4), $R^8$ represents a hydrogen atom or a methyl group; and $R^9$ represents a monovalent acid-labile group.

According to the photoresist composition, since the photoresist composition contains the polymer having a weight average molecular weight falling within the specific range and having the specific structural unit, and has a content of solids falling within the specific range, the functions as a chemically amplified resist can be exhibited, and enhanced sensitivity of the resist in the exposure step and a favorable pattern configuration owing to favorable resolving ability can be attained, resulting in an improvement of the resist performances. In addition, according to the photoresist composition, a resist pattern having an increased film thickness can be formed using a preexisting application apparatus without decreasing productivity thereof.

The viscosity at 25° C. is preferably no less than 50 mPa·s and no greater than 150 mPa·s.

The solvent composition may contain a first solvent having a viscosity of no greater than 1.5 mPa·s at 20° C. ("(C1) solvent" or "solvent (C1)"). In this instance, the content of the solvent (C1) in the total solvent composition is preferably no less than 60% by mass.

The first solvent preferably contains an ester compound, a linear ketone compound or a combination thereof.

The first solvent preferably contains an alkylene glycol monoalkyl ether acetate.

It is preferred that the solvent composition further contains a second solvent containing a compound that includes a hydroxy group, a cyclic ketone compound or a combination thereof (hereinafter, may be also referred to as "(C2) solvent" or "solvent (C2)").

It is preferred that the polymer further has the structural unit (II).

The proportion of the structural unit (II) with respect to the total structural units constituting the polymer (A) is no less than 20 mol % and no greater than 90 mol %.

It is preferred that the proportion of a structural unit that includes an aromatic ring with respect to the total structural units constituting the polymer is no less than 50 mol %. When the specific structural unit is included in the specific proportion, sufficient etching resistance can be ensured even in a process involving two or more etching steps such as three-dimensional device processing.

The photoresist composition is preferably for use in an exposure by way of a KrF excimer laser beam. The photoresist composition can be particularly suitably used in an exposure by way of a KrF excimer laser beam in light of a pattern size and etching resistance.

[Effects of the Invention]

The resist pattern-forming method and the photoresist composition according to the aspects of the present invention enable resist performances to be improved, and a resist pattern having an increased film thickness to be formed using a preexisting application apparatus without decreasing the productivity thereof. According to the substrate-processing method according to the aspect of the present invention, the substrate can be easily and favorably processed to form a three-dimensional structure.

[Description of Embodiments]

Resist Pattern-Forming Method

A resist pattern-forming method according to an embodiment of the present invention includes: providing a resist film using a photoresist composition (hereinafter, may be also referred to as "resist film-providing step"); exposing the resist film (hereinafter, may be also referred to as "exposure step"); and developing the resist film exposed (hereinafter, may be also referred to as "development step"), the photoresist composition containing: a polymer having a weight average molecular weight of no less than 1,000 and no greater than 7,500 and having a structural unit that includes an acid-labile group that is dissociated by an action of an acid; a radiation-sensitive acid generator; and a solvent composition, and the photoresist composition having a content of solids of no less than 20% by mass and no greater than 60% by mass.

Hereinafter, the resist pattern-forming method will be explained.

Resist Film-Providing Step

In this step, a resist film is provided using a photoresist composition described later. Examples of the substrate on which the resist film is provided includes a silicon wafer, a wafer coated with aluminum, and the like. Examples of the coating method include spin-coating and the like.

The film thickness of the resist film is preferably no less than 2 μm and no greater than 20 μm, and more preferably no less than 3 μm and no greater than 15 μm. When the resist film has a film thickness falling within the specific range, resist performances can be further improved, and more sufficient etching resistance can be ensured.

After the photoresist composition as described later is applied, a heat treatment at a temperature of about 70° C. to about 160° C. (hereinafter, may be also referred to as "prebaking (DD)") may be carried out as needed.

It is to be noted that in order to eliminate the influence of basic impurities or the like contained in an environmental atmosphere, a protective film as disclosed in, for example, Japanese Unexamined Patent Application, Publication No. H5-188598 and the like may be provided on the resist film.

Exposure Step

In this step, the resist film provided in the resist film-providing step is exposed. The exposure is carried out, for example, through a predetermined mask pattern.

The electromagnetic wave or charged particle ray used for the exposure may be appropriately selected from: an electromagnetic wave such as a visible light ray, an ultraviolet ray, a far ultraviolet ray and an X-ray; a charged particle ray such as an electron beam and an α-ray; and the like. However, far ultraviolet rays typified by an ArF excimer laser beam (wavelength: 193 nm) and a KrF excimer laser beam (wavelength: 248 nm) are preferred, and a KrF excimer laser beam (wavelength: 248 nm) is particularly preferred. Exposure conditions such as an exposure dose are appropriately selected in accordance with the formulation of the photoresist composition, the type of additives, and the like.

It is to be noted that, in order to constantly form a highly accurate and fine resist pattern, a heat treatment, for example, at a temperature of no less than 60° C. and no greater than 160° C. for a time period of no less than 30 sec (hereinafter, may be also referred to as "post exposure baking (PEB)") is preferably carried out after the exposure. When the temperature of the PEB is less than 70° C., a variation of sensitivity in accordance with the type of the substrate may be increased.

Development Step

In this step, the resist film exposed in the exposure step is developed with an alkaline developer solution to form a positive resist pattern.

An aqueous alkaline solution prepared by dissolving an alkaline compound such as an alkali metal hydroxide, ammonia, a mono-, di- or tri-alkylamine, a mono-, di- or tri-alkanolamine, a heterocyclic amine, a tetraalkylammonium hydroxide, choline, 1,8-diazabicyclo-[5.4.0]-7-undecene and 1,5-diazabicyclo-[4.3.0]-5-nonene such that a concentration of typically no less than 1% by mass and no greater than 10% by mass, preferably no less than 1% by mass and no greater than 5% by mass, and particularly preferably no less than 1% by mass and no greater than 3% by mass is attained is suitably used as an alkaline developer solution. In addition, a water soluble organic solvent such as methanol and ethanol, a surfactant or the like may be added as needed to the alkaline developer solution.

The treatment conditions in the development step involves typically a temperature of no less than 10° C. and no greater than 50° C. and a time period of no less than 10 sec and no greater than 200 sec, preferably a temperature of no less than 15° C. and no greater than 30° C. and a time period of no less than 15 sec and no greater than 100 sec, and more preferably a temperature of no less than 20° C. and no greater than 25° C. and a time period of no less than 15 sec and no greater than 90 sec.

For example, an organic solvent may be added to the developer solution. Examples of the organic solvent include:

ketones such as acetone, methyl ethyl ketone, methyl i-butyl ketone, cyclopentanone, cyclohexanone, 3-methylcyclopentanone and 2,6-dimethylcyclohexanone;

alcohols such as methyl alcohol, ethyl alcohol, n-propyl alcohol, i-propyl alcohol, n-butyl alcohol, t-butyl alcohol, cyclopentanol, cyclohexanol, 1,4-hexanediol and 1,4-hexanedimethylol;

ethers such as tetrahydrofuran and dioxane;

esters such as ethyl acetate, n-butyl acetate and i-amyl acetate;

aromatic hydrocarbons such as toluene and xylene;

phenol; acetonylacetone; dimethylformamide; and the like. It is to be noted that these organic solvents may be used alone, or in combination of two or more thereof.

The proportion of the organic solvent in the developer solution with respect to 100 parts by volume of the aqueous alkaline solution is preferably no greater than 100 parts by volume. When the proportion of the organic solvent is greater than 100 parts by volume, the developability may be impaired, leading to an increase of an undeveloped portion at a light-exposed site. In addition, an appropriate amount of surfactant or the like may be added to the developer solution. It is to be noted that washing with water followed by drying is preferably carried out after the development with the developer solution.

Substrate-Processing Method

A substrate-processing method according to another embodiment of the present invention includes: etching a substrate using as a mask the resist pattern formed by the resist pattern-forming method (hereinafter, may be also referred to as "substrate-etching step"); baring a part of an upper face of the substrate by etching the resist pattern after the substrate-etching step (hereinafter, may be also referred to as "baring step"); and thereafter repeating the etching of the substrate and the baring at least once in this order.

In the substrate-etching step, the resist pattern used as a mask in the etching processing may be formed in a similar manner to the aforementioned resist pattern-forming method.

Hereinafter, the substrate-etching step and the baring step will be explained.

Substrate-Etching Step

In this step, the substrate is etched using the resist pattern as a mask. The etching is preferably carried out under a dry etching condition using a fluorine-containing gas. In the dry etching condition, a gas and a condition which achieve an increased rate of etching of the substrate and a reduced film loss of the resist film located as an upper layer, are preferably selected. This step allows the configuration of the resist pattern to be transferred to the substrate.

Baring Step

In this step, a part of an upper face of the substrate is bared by etching the resist pattern after the substrate-etching step. The etching of the resist pattern is preferably carried out under a dry etching condition using an oxygen-containing gas. In the dry etching condition, a gas and a condition which achieve an increased rate of etching of the resist film and a reduced film loss of the substrate located as an underlayer are preferably selected. This step allows the configuration of the resist pattern as a mask for use in the further etching of the substrate to be processed into an arbitrary configuration.

In the substrate-processing method, after the baring step, a surface of the substrate not covered with the resist film, including a freshly bared upper face of the substrate, may be repeatedly subjected to etching processing by further repeating the substrate-etching step and the baring step at least once in this order, whereby the substrate can be processed to form a three-dimensional structure.

It is to be noted that when the desired three-dimensional structure is obtained, the resist pattern remaining after the final substrate-etching step may be removed through etching.

Photoresist Composition

Next, a photoresist composition (hereinafter, may be also referred to as "photoresist composition (I)") for use in the aforementioned resist pattern-forming method and substrate-processing method will be explained. The photoresist composition (I) contains: (A) a polymer having a structural unit (I) that includes an acid-labile group; (B) an acid generator; and (C) a solvent composition, and has a content of solids of no less than 20% by mass and no greater than 60% by mass. The photoresist composition (I) may contain (D) an acid diffusion controller, and may also contain other component within a range not leading to impairment of the effects of the present invention.

Since the polymer (A) has the structural unit (I) that includes an acid-labile group, the photoresist composition (I) can be used as, for example, a positive photoresist composition. According to the photoresist composition (I), the acid-labile group at a light-exposed site is dissociated by an acid generated from the acid generator (B) or the like to generate a polar group, whereby the polymer becomes soluble in a developer solution, resulting in effective formation of a positive resist pattern. In this regard, "acid-labile group" as referred to means a group that substitutes a hydrogen atom of a polar group such as e.g., a hydroxy group and a carboxy group and is dissociated by an action of an acid. Examples of the structural unit (I) that includes an acid-labile group include structural units represented by the formula (1-2), the formula (1-4) and the like as described later, and the like.

Hereinafter, each constitutive component will be explained.

(A) Polymer

The polymer (A) has a structural unit (I) that includes an acid-labile group, and has a weight average molecular weight of no less than 1,000 and no greater than 7,500. The polymer (A) preferably has, in addition to the structural unit (I), a structural unit (II) represented by the formula (1-1) as described later, may have a structural unit (III) and a structural unit (IV) as described later, and may have other structural unit besides the structural units (I) to (IV). The polymer (A) may have one, or two or more types of each structural unit.

Hereinafter, each structural unit will be explained.
Structural Unit (I)

The structural unit (I) includes an acid-labile group. When the polymer (A) has the structural unit (I) that includes an acid-labile group, a pattern can be formed. The structural unit (I) is preferably a structural unit represented by the following formula (1-2).

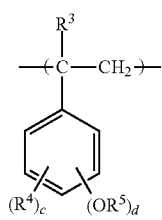

(1-2)

In the above formula (1-2), $R^3$ represents a hydrogen atom or a methyl group; $R^4$ represents a monovalent organic group that does not include an acid-labile group; c is an integer of 0 to 3, wherein in case where c is no less than 2, a plurality of $R^4$s are identical or different; $R^5$ represents a monovalent acid-labile group; and d is an integer of 1 to 3, wherein in a case where d is no less than 2, a plurality of $R^5$s are identical or different, and wherein a sum of c and d is no greater than 5.

$R^3$ preferably represents a hydrogen atom.

Examples of the monovalent organic group that does not include an acid-labile group, which is represented by $R^4$, include: monovalent hydrocarbon groups; a carboxy group; hydroxyalkyl groups such as a hydroxyethyl group and a hydroxypropyl group; hydroxycycloalkyl groups such as a hydroxycyclopentyl group and a hydroxycyclohexyl group; alkoxy groups such as a methoxy group and an ethoxy group; cycloalkyloxy groups such as a cyclopentyloxy group and a cyclohexyloxy group; monovalent nitrogen atom-containing organic groups such as an aminoethyl group and a dimethylaminoethyl group; and the like.

The monovalent acid-labile group represented by $R^5$ is exemplified by a substituted methyl group, a 1-substituted ethyl group, a 1-branched alkyl group, a triorganosilyl group, a triorganogermyl group, an alkoxycarbonyl group, an acyl group, a monovalent cyclic acid-labile group, and the like.

Examples of the substituted methyl group include a methoxymethyl group, a methylthiomethyl group, an ethoxymethyl group, an ethylthiomethyl group, a methoxyethoxymethyl group, a benzyloxymethyl group, a benzylthiomethyl group, a phenacyl group, a bromophenacyl group, a methoxyphenacyl group, a methylthiophenacyl group, an α-methylphenacyl group, a cyclopropylmethyl group, a benzyl group, a diphenylmethyl group, a triphenylmethyl group, a bromobenzyl group, a nitrobenzyl group, a methoxybenzyl group, a methylthiobenzyl group, an ethoxybenzyl group, an ethylthiobenzyl group, a piperonyl group, a methoxycarbonylmethyl group, an ethoxycarbonylmethyl group, a n-propoxycarbonylmethyl group, an i-propoxycarbonylmethyl group, a n-butoxycarbonylmethyl group, a t-butoxycarbonylmethyl group, and the like.

Examples of the 1-substituted ethyl group include a 1-methoxyethyl group, a 1-methylthioethyl group, a 1,1-dimethoxyethyl group, a 1-ethoxyethyl group, a 1-ethylthioethyl group, a 1,1-diethoxyethyl group, a 1-propoxyethyl group, a 1-cyclohexyloxyethyl group, a 1-phenoxyethyl group, a 1-phenylthioethyl group, a 1,1-diphenoxyethyl group, a 1-benzyloxyethyl group, a 1-benzylthioethyl group, a 1-cyclopropylethyl group, a 1-phenyl ethyl group, a 1,1-diphenylethyl group, a 1-methoxycarbonylethyl group, a 1-ethoxycarbonylethyl group, a 1-n-propoxycarbonylethyl group, a 1-isopropoxycarbonylethyl group, a 1-n-butoxycarbonylethyl group, a 1-t-butoxycarbonyl ethyl group, and the like.

Examples of the 1-branched alkyl group include an i-propyl group, a sec-butyl group, a t-butyl group, a 1,1-dimethylpropyl group, a 1-methylbutyl group, a 1,1-dimethylbutyl group, and the like.

Examples of the triorganosilyl group include a trimethylsilyl group, an ethyldimethylsilyl group, a diethylmethylsilyl group, a triethylsilyl group, a dimethyl-i-propylsilyl group, a methyl-di-i-propylsilyl group, a tri-i-propylsilyl group, a t-butyldimethylsilyl group, a di-t-butylmethylsilyl group, a tri-t-butylsilyl group, a dimethylphenylsilyl group, a methyldiphenylsilyl group, a triphenylsilyl group, and the like.

Examples of the triorganogermyl group include a trimethylgermyl group, an ethyldimethylgermyl group, a diethylmethylgermyl group, a triethylgermyl group, a dimethyl-i-propylgermyl group, a methyl-di-i-propylgermyl group, a tri-i-propylgermyl group, a t-butyldimethylgermyl group, a di-t-butylmethylgermyl group, a tri-t-butylgermyl group, a dimethylphenylgermyl group, a methyldiphenylgermyl group, a triphenylgermyl group, and the like.

Examples of the alkoxycarbonyl group include a methoxycarbonyl group, an ethoxycarbonyl group, an i-propoxycarbonyl group, a t-butoxycarbonyl group, and the like.

Examples of the acyl group include an acetyl group, a propionyl group, a butyryl group, a heptanoyl group, a hexanoyl group, a valeryl group, a pivaloyl group, an isovaleryl group, a lauroyl group, a myristoyl group, a palmitoyl group, a stearoyl group, an oxalyl group, a malonyl group, a succinyl group, a glutaryl group, an adipoyl group, a piperoyl group, a suberoyl group, an azelaoyl group, a sebacoyl group, an acryloyl group, a propioloyl group, a methacryloyl group, a crotonoyl group, an oleoyl group, a maleoyl group, a fumaroyl group, a mesaconoyl group, a camphoroyl group, a benzoyl group, a phthaloyl group, an isophthaloyl group, a terephthaloyl group, a naphthoyl group, a toluoyl group, a hydroatropoyl group, an atropoyl group, a cinnamoyl group, a furoyl group, a thenoyl group, a nicotinoyl group, an isonicotinoyl group, and the like.

Examples of the monovalent cyclic acid-labile group include a cyclopropyl group, a cyclopentyl group, a cyclohexyl group, a cyclohexenyl group, a 4-methoxycyclohexyl group, a tetrahydrofuranyl group, a tetrahydropyranyl group, a tetrahydrothiofuranyl group, a tetrahydrothiopyranyl group, a 3-bromotetrahydropyranyl group, a 4-methoxytetrahydropyranyl group, a 4-methoxytetrahydrothiopyranyl group, a 3-tetrahydrothiophene-1,1-dioxide group, and the like.

Among these, a t-butyl group, a benzyl group, a 1-methoxyethyl group, a 1-ethoxyethyl group, a trimethylsilyl group, a t-butoxycarbonyl group, a t-butoxycarbonylmethyl group, a tetrahydrofuranyl group, a tetrahydropyranyl group, a tetrahydrothiofuranyl group and a tetrahydrothiopyranyl group are preferred, and a t-butyl group is more preferred.

In the above formula (1-2), c is preferably 0 or 1, and more preferably 0 in light of the ease of production. d is preferably 1 or 2, and more preferably 1.

Examples of the polymerizable unsaturated compound that gives the structural unit represented by the above formula (1-2) include 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, acetoxystyrene, and the like. Among these, 4-t-butoxystyrene is preferred.

The proportion of the structural unit represented by the above formula (1-2) with respect to the total structural units constituting the polymer (A) is preferably no less than 10 mol % and no greater than 45 mol %, and more preferably no less than 15 mol % and no greater than 40 mol % for positive photoresist compositions. When the proportion of the structural unit represented by the formula (1-2) falls within the specific range, a favorable sensitivity can be attained and a pattern exhibiting a high resolution can be formed.

Another suitable examples of the structural unit (I) include a structural unit represented by the following formula (1-4).

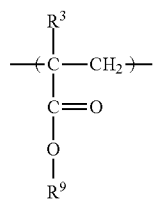

(1-4)

In the above formula (1-4), $R^8$ represents a hydrogen atom or a methyl group; and $R^9$ represents a monovalent acid-labile group.

$R^8$ preferably represents a hydrogen atom.

Examples of the monovalent acid-labile group represented by $R^9$ include a t-butyl group, a 1-methylcyclopentyl group, a 1-ethylcyclopentyl group, a 2-methyladamantyl group, a 2-ethyladamantyl group, and the like.

Examples of the monomer that gives the structural unit represented by the above formula (1-4) include t-butyl (meth)acrylate, 1-methylcyclopentyl(meth)acrylate, 1-ethylcyclopentyl(meth)acrylate, 2-methyladamantyl(meth)acrylate, 2-ethyladamantyl(meth)acrylate, and the like.

The proportion of the structural unit represented by the above formula (1-4) with respect to the total structural units constituting the polymer (A) is preferably no less than 0 mol % and no greater than 60 mol %, and more preferably no less than 10 mol % and no greater than 50 mol % for positive photoresist compositions. When the proportion of the structural unit represented by the formula (1-4) is greater than 60 mol %, insufficient dry etching resistance may be caused.

Alternatively, the structural unit (I) may be a structural unit represented by the following formula (1-4-a) that forms a cross-linked structure between molecular chains thereof via a divalent acid-labile group. When the polymer (A) has the structural unit represented by the following formula (1-4-a), a polar group is formed and the molecular weight of the polymer (A) is decreased in the development of the resist film; therefore, in the case of positive photoresist compositions, a contrast can be improved.

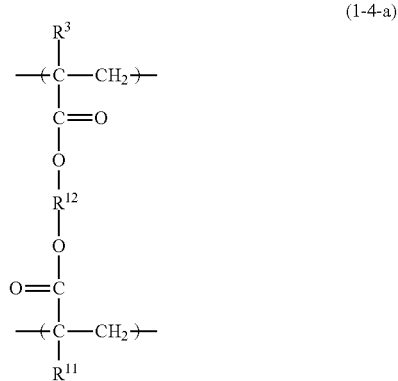

(1-4-a)

In the above formula (1-4-a), $R^{10}$ and $R^{11}$ each independently represent a hydrogen atom or a methyl group; and $R^{12}$ represents a divalent acid-labile group.

$R^{10}$ and $R^{11}$ preferably represent a hydrogen atom.

Examples of the divalent acid-labile group represented by $R^{12}$ include a 1,1,3,3-tetramethylpropanediyl group, a 1,1,4,4-tetramethylbutanediyl group, a 1,1,5,5-tetramethylpentanediyl group, and the like. Among these, a 1,1,4,4-tetramethylbutanediyl group is preferred.

Examples of the monomer that gives the structural unit represented by the above formula (1-4-a) include 2,4-dimethylpentane-2,4-diacrylate, 2,5-dimethylhexane-2,5-diacrylate, 2,6-dimethylheptane-2,6-diacrylate, and the like. Among these, 2,5-dimethylhexane-2,5-diacrylate is preferred.

The proportion of the structural unit represented by the above formula (1-4-a) with respect to the total structural units constituting the polymer (A) is preferably no greater than 10 mol %, and more preferably no less than 1 mol % and no greater than 5 mol %. When the proportion of the structural unit represented by the formula (1-4-a) is greater than 10 mol %, the pattern formability of the photoresist composition (I) may be deteriorated.

Structural Unit (II)

The structural unit (II) is represented by the following formula (1-1). When the polymer (A) has such a structural unit (II), the affinity of the polymer (A) to an alkaline developer solution can be improved.

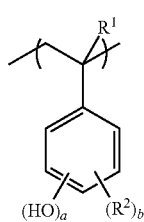

(1-1)

In the above formula (1-1), $R^1$ represents a hydrogen atom or an alkyl group having 1 to 5 carbon atoms; $R^2$ represents a substituted or unsubstituted alkyl group having 1 to 12 carbon atoms, a substituted or unsubstituted alkoxy group having 1 to 12 carbon atoms, or a substituted or unsubstituted monovalent aromatic hydrocarbon group having 6 to 12 carbon atoms; a is an integer of 1 to 3; and b is an integer of 0 to 3, wherein a sum of a and b is no greater than 5, and wherein in a case where b is no less than 2, a plurality of $R^2$s are identical or different.

$R^1$ preferably represents a hydrogen atom or a methyl group.

In the above formula (1-1), the binding position of the hydroxyl group to the phenyl group is not particularly limited, and in a case of a being 1, may be located in any of o-, m-, and p-positions relative to the carbon atom bonding to the polymer chain, and preferably in a p-position. In a case where a is 2 or 3, the binding position is arbitrarily selected.

The alkyl group having 1 to 12 carbon atoms which may be represented by $R^2$ may be linear or branched, and examples thereof include a methyl group, an ethyl group, a n-propyl group, an i-propyl group, a n-butyl group, a 2-methylpropyl group, a 1-methylpropyl group, a t-butyl group, and the like.

The alkoxy group having 1 to 12 carbon atoms which may be represented by $R^2$ may be linear or branched, and examples thereof include a methoxy group, an ethoxy group, a n-propoxy group, an i-propoxy group, a n-butoxy group, a 2-methylpropoxy group, a 1-methylpropoxy group, a t-butoxy group, and the like.

Examples of the monovalent aromatic hydrocarbon group having 6 to 12 carbon atoms which may be represented by $R^2$ include a phenyl group, a benzyl group, a tolyl group, and the like.

Examples of the substituent that may be included in the alkyl group, the alkoxy group and the aryl group represented by $R^2$ include halogen atoms such as a fluorine atom, a chlorine atom, a bromine atom and an iodine atom; a hydroxy group; a carboxy group; a nitro group; a cyano group; and the like. The alkyl group, the alkoxy group and the aryl group represented by $R^2$ may include at least one substituent of one type alone, or may include at least one substituent of a plurality of types.

$R^2$ represents preferably an alkyl group, and more preferably a methyl group, an ethyl group, a n-butyl group or a t-butyl group.

In the above formula (1-1), a is preferably 1 or 2, and more preferably 1, and b is preferably 0 or 1, and more preferably 0 in light of the ease of production. Moreover, a particularly preferable structural unit represented by the above formula (1-1) is a structural unit formed through the opening of the polymerizable unsaturated bond of 4-hydroxystyrene.

The proportion of the structural unit (II) with respect to the total structural units constituting the polymer (A) is preferably no less than 20 mol % and no greater than 90 mol %, more preferably no less than 30 mol % and no greater than 85 mol %, and still more preferably no less than 40 mol % and no greater than 80 mol %. When the proportion falls within the above range, the polymer (A) located at a light-exposed site can be sufficiently dissolved in a developer solution, leading to a favorable configuration of a resist pattern.

Structural Unit (III)

The structural unit (III) is represented by the following formula (1-3).

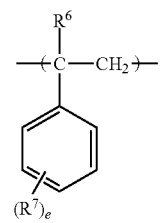

(1-3)

In the above formula (1-3), $R^6$ represents a hydrogen atom or a methyl group; $R^7$ represents a monovalent hydrocarbon group or a non-acid-dissociable monovalent oxyhydrocarbon group; and e is an integer of 0 to 3, wherein in a case where e is no less than 2, a plurality of $R^7$s are identical or different.

$R^6$ preferably represents a hydrogen atom.

Examples of the monovalent hydrocarbon group which may be represented by $R^7$ include: alkyl groups such as a methyl group, an ethyl group, a n-propyl group, an i-propyl group and a t-butyl group; cycloalkyl groups such as a cyclopentyl group and a cyclohexyl group; aromatic hydrocarbon groups such as a phenyl group, a naphthyl group and a benzyl group; and the like.

Examples of the non-acid-dissociable monovalent oxyhydrocarbon group which may be represented by $R^7$ include primary or secondary alkoxy groups such as a methoxy group, an ethoxy group, a n-propoxy group, an i-propoxy group and a n-butoxy group; cycloalkyloxy groups such as a cyclopentyloxy group and a cyclohexyloxy group; oxyaromatic hydrocarbon groups such as a phenoxy group and a benzyloxy group; and the like.

Among these, $R^7$ represents preferably an alkyl group or an alkoxy group, more preferably a methyl group, an ethyl group, a methoxy group or an ethoxy group, still more preferably a methyl group or a methoxy group, and particularly preferably a methyl group.

In the above formula (1-3), e is preferably an integer of 0 to 2, more preferably 0 or 1, and still more preferably 0.

Examples of the monomer that gives the structural unit (III) include styrene, α-methylstyrene, 2-methylstyrene, 3-methylstyrene, 4-methylstyrene, 2-methoxystyrene, 3-methoxystyrene, 4-methoxystyrene, and the like. Among these, styrene is preferred.

The proportion of the structural unit (III) with respect to the total structural units constituting the polymer (A) is preferably no greater than 20 mol %, and more preferably no less than 0 mol % and no greater than 10 mol % for positive photoresist compositions. When the proportion of the structural unit (III) is greater than 20 mol %, the developability of the resist film may be deteriorated.

Other Structural Unit

The polymer (A) may have other structural unit in addition to the structural units (I) to (III).

Examples of the other structural unit include the structural unit (IV) derived from monomers including:

(meth)acrylic acid esters such as methyl(meth)acrylate, ethyl(meth)acrylate, n-propyl(meth)acrylate, i-propyl(meth)acrylate, n-butyl(meth)acrylate, 2-methylpropyl(meth)acrylate, 1-methylpropyl(meth)acrylate, n-pentyl(meth)acrylate, neopentyl(meth)acrylate, n-hexyl(meth)acrylate, 2-ethylhexyl(meth)acrylate, 2-hydroxyethyl(meth)acrylate, 2-hydroxy-n-propyl(meth)acrylate, 3-hydroxy-n-propyl(meth)acrylate, phenyl(meth)acrylate, benzyl(meth)acrylate, 1-methyl-2-adamantyl(meth)acrylate, 1-ethyl-2-adamantyl(meth)acrylate, 8-methyl-8-tricyclodecyl(meth)acrylate, 8-ethyl-8-tricyclodecyl(meth)acrylate, 3-methyl-3-tetracyclododecenyl(meth)acrylate, 3-ethyl-3-tetracyclododecenyl(meth)acrylate and 2,5-dimethylhexane-2,5-di(meth)acrylate;

unsaturated carboxylic acids (and anhydrides thereof) such as (meth)acrylic acid, crotonic acid, maleic acid, maleic anhydride, fumaric acid and cinnamic acid;

unsaturated carboxylic acid carboxyalkyl esters such as 2-carboxyethyl(meth)acrylate, 2-carboxy-n-propyl(meth)acrylate and 3-carboxy-n-propyl(meth)acrylate;

unsaturated nitrile compounds such as (meth)acrylonitrile, α-chloroacrylonitrile, crotononitrile, maleonitrile and fumaronitrile;

unsaturated amide compounds such as (meth)acrylamide, N,N-dimethyl(meth)acrylamide, crotonamide, maleinamide and fumaramide;

unsaturated imide compounds such as maleimide, N-phenylmaleimide and N-cyclohexylmaleimide; and nitrogen-containing vinyl compounds such as N-vinyl-ε-caprolactam, N-vinylpyrrolidone, 2-vinylpyridine, 3-vinylpyridine, 4-vinylpyridine, 2-vinylimidazole and 4-vinylimidazole, and the like. It is to be noted that the structural unit (IV) does not include an acid-labile group.

The proportion of the structural unit (IV) with respect to the total structural units constituting the polymer (A) is typically no greater than 25 mol %, and preferably no greater than 15 mol %. When the proportion of the structural unit (IV) is greater than 25 mol %, the resolution of the formed resist pattern may be deteriorated.

The polymer (A) preferably has a structural unit that includes an aromatic ring. The proportion of the structural unit that includes an aromatic ring is preferably no less than 50 mol % and no greater than 100 mol %, more preferably no less than 70 mol % and no greater than 100 mol %, and still more preferably no less than 80 mol % and no greater than 100 mol %. When the polymer (A) has the structural unit in the proportion falling within the specific range, sufficient etching resistance can be ensured even in a process involving two or more etching steps such as three-dimensional device processing.

Examples of the polymer (A) include 4-hydroxystyrene/4-t-butoxystyrene copolymers, 4-hydroxystyrene/4-t-butoxystyrene/1-methylcyclopentyl acrylate copolymers, 4-hydroxystyrene/4-t-butoxystyrene/1-ethylcyclopentyl acrylate copolymers, 4-hydroxystyrene/4-t-butoxystyrene/styrene copolymers, 4-hydroxystyrene/t-butyl acrylate/styrene copolymers, 4-hydroxystyrene/1-methylcyclopentyl acrylate/styrene copolymers, 4-hydroxystyrene/1-ethylcyclopentyl acrylate/styrene copolymers, 4-hydroxystyrene/4-t-butoxystyrene/2,5-dimethylhexane-2,5-diacrylate copolymers, 4-hydroxystyrene/2-ethyladamantyl acrylate/styrene copolymers, 4-hydroxystyrene/2-ethyladamantyl acrylate copolymers, 4-hydroxystyrene/4-(1-ethoxyethoxy)styrene/4-tert-butoxystyrene copolymers, 4-hydroxystyrene/4-(1-ethoxyethoxy)styrene copolymers, 4-hydroxystyrene/4-(1-ethoxyethoxy)styrene/styrene copolymers, 4-hydroxystyrene/4-t-butoxystyrene/N,N-dimethylacrylamide copolymers, and the like. Among these, 4-hydroxystyrene/4-t-butoxystyrene/styrene copolymers, 4-hydroxystyrene/4-t-butoxystyrene/2,5-dimethylhexane-2,5-diacrylate copolymers and 4-hydroxystyrene/4-t-butoxystyrene/N,N-dimethylacrylamide copolymers are preferred.

Synthesis Method of Polymer (A)

The method for synthesis of the polymer (A) is not particularly limited, and conventionally well-known methods may be employed. Examples of the synthesis method include: (i) a method including subjecting substituted or unsubstituted hydroxystyrene in which a phenolic hydroxyl group thereof is protected with a protecting group, for example, butoxycarbonyloxystyrene, butoxystyrene, acetoxystyrene, tetrahydropyranyloxystyrene or the like, and a monomer that gives a predetermined structural unit other than the structural unit (II) to addition polymerization, and thereafter hydrolyzing and eliminating the protecting group by an action of an acid catalyst or a base catalyst; (ii) a method including subjecting substituted or unsubstituted hydroxystyrene and a monomer that corresponds to a predetermined structural unit other than the structural unit (II) to addition polymerization; and the like. Among these, the method (i) is preferred in light of a possibility of efficient synthesis of the polymer (A).

The addition polymerization is exemplified by radical polymerization, anionic polymerization, cationic polymerization, thermal polymerization and the like, and anionic polymerization and cationic polymerization are preferred in light of a low dispersity index (Mw/Mn ratio) of the resulting copolymer.

Examples of the acid catalyst used for the hydrolysis reaction in the method (i) include inorganic acids such as hydrochloric acid and sulfuric acid. Moreover, examples of the base catalyst include: organic bases such as trialkylamines; inorganic bases such as sodium hydroxide; and the like.

The lower limit of polystyrene equivalent weight average molecular weight (Mw) of the polymer (A) as determined by gel permeation chromatography (GPC) is 1,000, preferably 2,000, and more preferably 3,000. The upper limit of the Mw is 7,500, preferably 7,000, and more preferably 6,500.

The ratio (Mw/Mn) of the Mw to the polystyrene equivalent number average molecular weight (Mn) as determined by GPC of the polymer (A) is preferably 1 to 3, and more preferably 1 to 2.

It is to be noted that the aforementioned Mw and Mn are determined by gel permeation chromatography (GPC) under analytical conditions involving: a flow rate of 1.0 mL/min; tetrahydrofuran as an elution solvent; and a column temperature of 40° C., using GPC columns (G2000HXL×2, G3000HXL×1, and G4000HXL×1) manufactured by Tosoh Corporation and mono-dispersed polystyrenes as a standard.

The content of the polymer (A) in the photoresist composition (I) with respect to the total solid content (the total mass of the components other than the solvent composition (C)) is typically no less than 70% by mass, preferably no less than 80% by mass, and more preferably no less than 90% by mass. The polymer (A) may be used alone, or in combination of two or more thereof.

(B) Acid Generator

The acid generator (B) is a component that generates an acid upon an exposure. The acid-labile group or the like included in the polymer (A) is dissociated by the generated acid to generate an acidic group or the like, whereby the solubility of the polymer (A) in a developer solution is altered, leading to the formation of a resist pattern. The mode of incorporation of the acid generator (B) in the photoresist composition (I) may be in a low molecular weight compound form (hereinafter, may be also referred to as "(B) acid generating agent" or "acid generating agent (B)", as appropriate), as described later, or in an incorporated form as a part of the polymer, or in both of these forms. One, or two or more types of the acid generator (B) may be contained.

A nonionic acid generating agent is preferred as the acid generating agent (B). Examples of the nonionic acid generating agent include an N-sulfonyloxyimide compound represented by the following formula (B1), and the like.

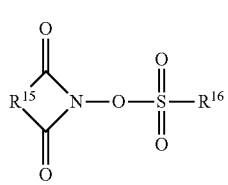
(B1)

In the above formula (B1), $R^{15}$ represents an alkylene group, an arylene group, an alkoxylene group, a cycloalkylene group, or a divalent group having a cyclic skeleton including a unsaturated bond; and $R^{16}$ represents an alkyl group unsubstituted or substituted with a halogen atom or a cycloalkyl group, a cycloalkyl group unsubstituted or substituted with a group including an ester bond, an aryl group unsubstituted or substituted with a halogen atom or an alkyl group, or an aralkyl group unsubstituted or substituted with a fluorine atom, a hydroxy group, an alkoxy group or a carboxy group.

Examples of the N-sulfonyloxyimide compound include N-(trifluoromethanesulfonyloxy)bicyclo[2.2.1]hept-5-ene-2,3-dicarboximide, N-(10-camphorsulfonyloxy)succinimide, N-(4-toluenesulfonyloxy)succinimide, N-(nonafluoro-n-butanesulfonyloxy)bicyclo[2.2.1]hept-5-ene-2,3-dicarboximide, N-(benzenesulfonyloxy)bicyclo[2.2.1]hept-5-ene-2,3-dicarboximide, N-{(5-methyl-5-carboxymethylbicyclo[2.2.1]heptan-2-yl)sulfonyloxy}succinimide, and the like.

A sulfonyldiazomethane compound is also preferred as the nonionic acid generating agent. Examples of the sulfonyldiazomethane compound include a compound represented by the following formula (B2), and the like.

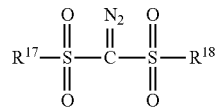
(B2)

In the above formula (B2), $R^{17}$ and $R^{18}$ each independently represent an alkyl group unsubstituted or substituted with a halogen atom, a cycloalkyl group unsubstituted or substituted with a halogen atom, an aryl group unsubstituted or substituted with a halogen atom, or an aralkyl group unsubstituted or substituted with a fluorine atom, a hydroxy group, an alkoxy group or a carboxy group.

Examples of the sulfonyldiazomethane compound include bis(trifluoromethanesulfonyl)diazomethane, bis(cyclohexanesulfonyl)diazomethane, bis(phenylsulfonyl)diazomethane, bis(4-toluenesulfonyl)diazomethane, bis(2,4-dimethylbenzenesulfonyl)diazomethane, bis(4-t-butylphenylsulfonyl)diazomethane, bis(4-chlorobenzenesulfonyl)diazomethane, methylsulfonyl-4-toluenesulfonyldiazomethane, cyclohexanesulfonyl-4-toluenesulfonyldiazomethane, cyclohexanesulfonyl-1,1-dimethylethanesulfonyldiazomethane, bis(1,1-dimethylethanesulfonyl)diazomethane, bis(1-methylethanesulfonyl)diazomethane, bis(3,3-dimethyl-1,5-dioxaspiro[5.5]dodecane-8-sulfonyl)diazomethane, bis(1,4-dioxaspiro[4.5]decane-7-sulfonyl)diazomethane, and the like.

An onium salt may also be used as the acid generating agent (B).

Examples of the onium salt compound include a compound represented by the following formula (B3) or (B4), and the like.

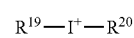
(B3)

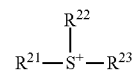
(B4)

In the above formula (B3), $R^{19}$ and $R^{20}$ each independently represent a substituted or unsubstituted linear or branched alkyl group having 1 to 10 carbon atoms, or a substituted or unsubstituted aryl group having 6 to 18 carbon atoms, or $R^{19}$ and $R^{20}$ taken together represent a cyclic structure, together with the iodine atom to which $R^{19}$ and $R^{20}$ bond.

In the above formula (B4), $R^{21}$, $R^{22}$ and $R^{23}$ each independently represent a substituted or unsubstituted linear or branched alkyl group having 1 to 10 carbon atoms, or a substituted or unsubstituted aryl group having 6 to 18 carbon atoms, or two of $R^{21}$, $R^{22}$ and $R^{23}$ taken together represent a cyclic structure, together with the sulfur atom to which the two of $R^{21}$, $R^{22}$ and $R^{23}$ bond, wherein the rest of $R^{21}$, $R^{22}$ and $R^{23}$ represents a substituted or unsubstituted linear or branched alkyl group having 1 to 10 carbon atoms, or a substituted or unsubstituted aryl group having 6 to 18 carbon atoms.

In the above formulae (B3) and (B4), $X^-$ represents $R-SO_3^-$, wherein R represents an alkyl group unsubstituted or substituted with a fluorine atom, a hydroxy group, an alkoxy group or a carboxy group, a cycloalkyl group unsubstituted or substituted with a fluorine atom, a hydroxy group, an alkoxy group or a carboxy group, an aryl group unsubstituted or substituted with a fluorine atom, a hydroxy group, an alkoxy group or a carboxy group, or an aralkyl group unsubstituted or substituted with a fluorine atom, a hydroxy group, an alkoxy group or a carboxy group.

$R-SO_3^-$ preferably represents trifluoromethanesulfonate, nonafluoro-n-butanesulfonate, benzenesulfonate, 10-camphorsulfonate, 2-trifluoromethylbenzenesulfonate, 4-trifluoromethylbenzenesulfonate, 2,4-difluorobenzenesulfonate, perfluorobenzenesulfonate, 2-(bicyclo[2.2.1]heptan-2-yl)-1,1-difluoroethanesulfonate, or 2-(bicyclo[2.2.1]heptan-2-yl)ethanesulfonate.

Examples of an acid generating agent (B) other than those described above include disulfonylmethane compounds, oxime sulfonate compounds, hydrazine sulfonate compounds, and the like.

Examples of the disulfonylmethane compound include a compound represented by the following formula (B5), and the like.

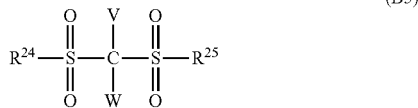

(B5)

In the above formula (B5), $R^{24}$ and $R^{25}$ each independently represent a linear or branched monovalent hydrocarbon group, a cycloalkyl group, an aryl group, an aralkyl group, or a monovalent organic group having a hetero atom; and V and W each independently represent a hydrogen atom, an aryl group, a linear or branched monovalent hydrocarbon group or a monovalent organic group having a hetero atom, wherein at least one of V and W represents an aryl group, or V and W taken together represent a monocarbocyclic structure including at least one unsaturated bond or a polycarbocyclic structure including at least one unsaturated bond, or V and W optionally taken together represent a group represented by the following formula (B6).

(B6)

In the above formula (B6), V' and W' each independently represent a hydrogen atom, a halogen atom, a linear or branched alkyl group, a cycloalkyl group, an aryl group or an aralkyl group, or V' and W' that bond to an identical or different carbon atom taken together represent a monocarbocyclic structure; and n is an integer of 2 to 10, wherein in a case where n is no less than 2, a plurality of V's are identical or different, and a plurality of W's are identical or different.

Examples of the oxime sulfonate compound include a compound represented by the following formula (B7) or (B8), and the like.

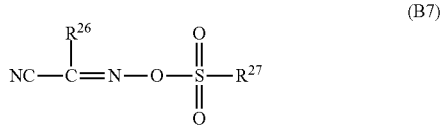

(B7)

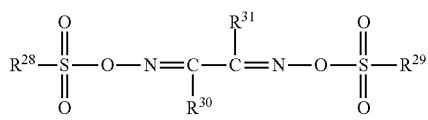

(B8)

In the above formula (B7), $R^{26}$ and $R^{27}$ each independently represent a monovalent organic group.

In the above formula (B8), $R^{28}$ to $R^{31}$ each independently represent a monovalent organic group.

In a case where the acid generator (B) is the acid generating agent (B), the content of the acid generator (B) with respect to 100 parts by mass of the polymer (A) is preferably no less than 0.1 parts by mass and no greater than 30 parts by mass, and more preferably no less than 0.5 parts by mass and no greater than 20 parts by mass. When the content of the acid generating agent (B) is no less than 0.1 parts by mass, the photoresist composition (I) exhibits proper sensitivity and developability. On the other hand, when the content of the acid generating agent (B) is no greater than 30 parts by mass, the formed resist film may exhibit favorable transparency to radioactive rays, a pattern configuration, heat resistance, and the like.

(C) Solvent Composition

The solvent composition (C) is not particularly limited as long as it can at least dissolve the polymer (A), the acid generator (B), and other component added as needed. The solvent composition (C) may contain one, or two or more types of the solvent.

The solvent composition (C) preferably contains (C1) a solvent having a viscosity of no greater than 1.5 mPa·s at 20° C. The lower limit of the viscosity of the solvent (C1) is preferably 0.1 mPa·s. Moreover, the content of the solvent (C1) in the solvent composition (C) is preferably no less than 60% by mass and no greater than 100% by mass, and more preferably no less than 65% by mass and no greater than 100% by mass. When such a solvent (C1) is used, the viscosity of the photoresist composition (I) may be decreased, whereby the productivity in the production and/ or the ease of handling in the coating thereof can be improved.

The solvent (C1) preferably contains at least one selected from the group consisting of an ester compound and a linear ketone compound.

Examples of the ester compound include:
alkylene glycol monoalkyl ether acetate such as:
ethylene glycol monoalkyl ether acetates such as ethylene glycol monomethyl ether acetate and ethylene glycol monoethyl ether acetate; and
propylene glycol monoalkyl ether acetates such as propylene glycol monomethyl ether acetate;
aliphatic carboxylic acid esters such as methyl acetate, ethyl acetate, n-propyl acetate, i-propyl acetate, n-butyl acetate, i-butyl acetate, n-amyl acetate, i-amyl acetate, ethyl propionate, n-butyl propionate and i-amyl propionate;
other esters such as ethyl methoxyacetate, ethyl ethoxyacetate, methyl 3-methoxypropionate, ethyl 3-methoxypropionate, methyl 3-ethoxypropionate, ethyl 3-ethoxypropionate and methyl acetoacetate; and the like.

Among these,
as an alkylene glycol monoalkyl ether acetate, propylene glycol monoalkyl ether acetates are preferred, and propylene glycol monomethyl ether acetate is more preferred;
as an aliphatic carboxylic acid ester, acetic acid esters are preferred, and n-butyl acetate is more preferred; and
as other ester, methoxypropionic acid esters are preferred, and methyl methoxypropionate is more preferred.

Examples of the linear ketone compound include methyl ethyl ketone, 2-pentanone, 2-hexanone, 2-heptanone, 3-heptanone, 4-heptanone, and the like. Among these, 2-heptanone is preferred.

The solvent (C1) preferably contains at least one selected from the group consisting of an alkylene glycol monoalkyl ether acetate, an aliphatic carboxylic acid ester and a linear ketone compound, and more preferably contains two selected from the aforementioned group. When the solvent (C1) contains the aforementioned compound, the photoresist composition (I) may have a more proper viscosity.

Preferably, the solvent composition (C) further contains (C2) a solvent that is at least one selected from the group consisting of a compound that includes a hydroxy group and a cyclic ketone compound.

Examples of the compound that includes a hydroxy group include: ethyl lactate; propylene glycol monoalkyl ethers such as propylene glycol monomethyl ether, propylene glycol monoethyl ether, propylene glycol mono-n-propyl ether, propylene glycol mono-i-propyl ether and propylene glycol mono-n-butyl ether; and the like. Among these, ethyl lactate is preferred.

Examples of the cyclic ketone compound include cyclohexanone, cyclopentanone, dihydrofuran-2(3H)-one, and the like. Among these, cyclohexanone is preferred.

The solvent composition (C) may contain other solvent that is different from the solvent (C1) and the solvent (C2) for the purpose of dissolving the solid content and/or adjusting the viscosity.

Examples of the other solvent include:

aromatic hydrocarbons such as toluene and xylene;

propylene glycol dialkyl ethers such as propylene glycol dimethyl ether, propylene glycol diethyl ether, propylene glycol di-n-propyl ether and propylene glycol di-n-butyl ether;

amides such as N-methylformamide, N,N-dimethylformamide, N-methylacetamide, N,N-dimethylacetamide and N-methylpyrrolidone;

lactones such as γ-butyrolactone; and the like.

(D) Acid Diffusion Controller

The photoresist composition (I) preferably contains (D) an acid diffusion controller. The acid diffusion controller (D) exhibits the effect of controlling a diffusion phenomenon of the acid generated from the acid generator (B) or the like upon the exposure in the resist film, and inhibiting unfavorable chemical reactions in an unexposed region. The mode of incorporation of the acid diffusion controller (D) in the photoresist composition (I) may be in a low molecular weight compound form (hereinafter, may be also referred to as "(D) acid diffusion control agent" or "acid diffusion control agent (D)", as appropriate) as described later, or in an incorporated form as a part of the polymer, or in both of these forms. One, or two or more types of the acid diffusion controller (D) may be contained.

The acid diffusion control agent (D) is exemplified by a nitrogen-containing organic compound, a photosensitive basic compound, and the like. The nitrogen-containing organic compound is exemplified by a compound represented by the following formula (D-1) (hereinafter, may be also referred to as "nitrogen-containing compound (i)"), a compound having two nitrogen atoms within a single molecule (hereinafter, may be also referred to as "nitrogen-containing compound (ii)"), a polyamino compound having at least three nitrogen atoms or a polymer of a nitrogen-containing polymerizable compound (hereinafter, may be also referred to collectively as "nitrogen-containing compound (iii)"), an amide group-containing compound, a urea compound, a nitrogen-containing heterocyclic compound, and the like.

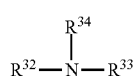

(D-1)

In the above formula (D-1), $R^{32}$, $R^{33}$ and $R^{34}$ each independently represent a hydrogen atom, a linear or branched alkyl group, a cycloalkyl group, an aryl group or an aralkyl group. A part or all of hydrogen atoms of the alkyl group, the cycloalkyl group, the aryl group and the aralkyl group are unsubstituted or substituted.

Examples of the nitrogen-containing compound (i) include: mono(cyclo)alkylamines such as n-hexylamine, n-heptylamine, n-octylamine, n-nonylamine, n-decylamine and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine and tricyclohexylamine; substituted alkylamines such as triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine and 2,6-diisopropyl aniline.

Examples of the nitrogen-containing compound (ii) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N",N"-pentamethyldiethylenetriamine, and the like.

Examples of the nitrogen-containing compound (iii) include polyethylene imine, polyallylamine, polymers of 2-dimethylaminoethylacrylamide, and the like.

Examples of the amide group-containing compound include: N-t-butoxycarbonyl group-containing amino compounds such as N-t-butoxycarbonyl-di-n-octylamine, N-t-butoxycarbonyl-di-n-nonylamine, N-t-butoxycarbonyl-di-n-decylamine, N-t-butoxycarbonyl-dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole and N-t-butoxycarbonyl-2-phenylbenzimidazole; as well as formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanurate, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include: imidazoles such as imidazole, 4-methylimidazole, 4-methyl-2-phenylimidazole, benzimidazole, 2-phenylbenzimidazole, 1-benzyl-2-methylimidazole and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxyquinoline, acridine and 2,2':6',2"-terpyridine; piperazines such as piperazine and 1-(2-hydroxyethyl)piperazine; as well as pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like. Among these, imidazoles are preferred, and 2-phenylbenzimidazole is more preferred.

The photosensitive basic compound is a component that is efficiently degraded to the corresponding neutral substance in an exposed region and remains intact in a light-unexposed site. Such a photosensitive basic compound allows the acid generated in the light-exposed site to be utilized more effectively as compared with non-photosensitive basic compounds, leading to an improvement of the sensitivity.

Although the photosensitive basic compound is not particularly limited as long as it exhibits the aforementioned properties, a compound represented by the following formula (D2-1) or (D2-2) is suitably used.

Examples of the halogen atom include a fluorine atom, a chlorine atom, a bromine atom, an iodine atom, and the like.

Examples of the alkyl group having 1 to 10 carbon atoms which may be represented by $R^{35}$ to $R^{39}$ include a methyl group, an ethyl group, a n-butyl group, a t-butyl group, and the like.

Examples of the monovalent alicyclic hydrocarbon group having 3 to 10 carbon atoms which may be represented by $R^{35}$ to $R^{39}$ include a cyclopentyl group, a cyclopentenyl group, a cyclohexyl group, a cyclohexenyl group, a norbornyl group, a norbornenyl group, an adamantyl group, and the like.

Examples of the substituent of the alkyl group and the alicyclic hydrocarbon group include: halogen atoms such as a fluorine atom, a chlorine atom, a bromine atom and an iodine atom; alkoxy groups; and the like.

Examples of the alkoxy group having 1 to 10 carbon atoms which may be represented by $R^{35}$ to $R^{39}$ include a methoxy group, a t-butoxy group, and the like.

Examples of the substituted alkyl group, the alicyclic hydrocarbon group and the alkoxy group include a trifluoromethyl group, a trichloromethyl group, a perfluorocyclopentyl group, a t-butoxycarbonylmethyloxy group, and the like.

$R^{35}$ to $R^{39}$ preferably represent a hydrogen atom or a t-butyl group, and more preferably a hydrogen atom.

Examples of the monovalent organic group represented by $R^D$ include alkyl groups optionally having a substituent, cycloalkyl groups optionally having a substituent, aryl groups optionally having a substituent, and the like.

The anion represented by $E^-$ or $Q^-$ is preferably at least one selected from the group consisting of $OH^-$, $CH_3COO^-$ and anions represented by the following formulae (X-1) to (X-8).

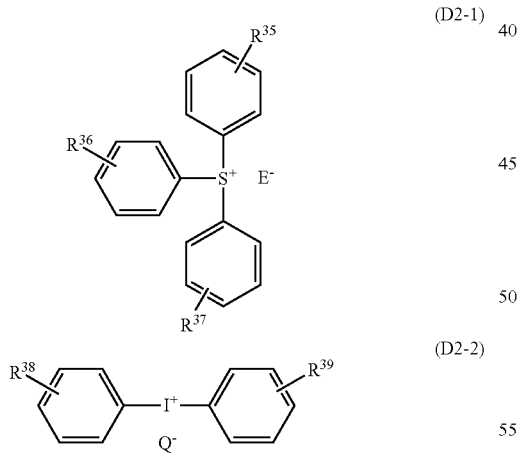

In the above formulae (D2-1) and (D2-2), $R^{35}$ to $R^{39}$ each independently represent a hydrogen atom, a halogen atom, an alkyl group having 1 to 10 carbon atoms, a monovalent alicyclic hydrocarbon group having 3 to 10 carbon atoms, or an alkoxy group having 1 to 10 carbon atoms, wherein a part or all of hydrogen atoms of the alkyl group, the alicyclic hydrocarbon group and the alkoxy group are unsubstituted or substituted; and $E^-$ and $Q^-$ each independently represent $OH^-$, $R^D-O^-$ or $R^D-COO^-$, wherein $R^D$ represents a monovalent organic group.

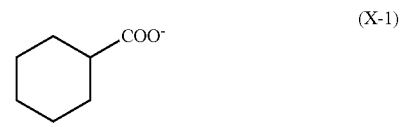

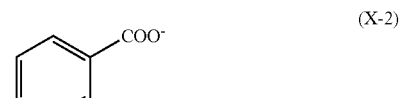

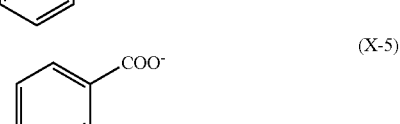

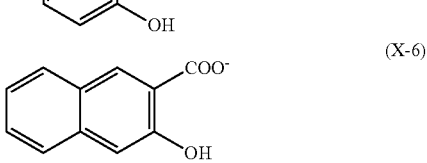

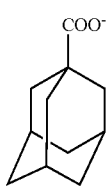

(X-7)

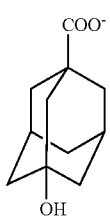

(X-8)

The photosensitive basic compound is preferably a triphenylsulfonium compound (the compound represented by the above formula (D2-1)), wherein the anion (E⁻) thereof is at least one selected from OH⁻, CH$_3$COO⁻ and the anions represented by the above formulae (X-5) and (X-7).

In a case where the acid diffusion controller (D) is the acid diffusion control agent (D), the content of the acid diffusion controller (D) with respect to 100 parts by mass of the polymer (A) is preferably no greater than 15 parts by mass, more preferably no less than 0.001 parts by mass and no greater than 10 parts by mass, still more preferably no less than 0.005 parts by mass and no greater than 5 parts by mass, and particularly preferably no less than 0.05 parts by mass and no greater than 3 parts by mass. When the content of the acid diffusion control agent (D) is greater than 15 parts by mass, the sensitivity as a resist and/or the developability at a light-exposed site may be deteriorated. To the contrary, when the content is less than 0.001 parts by mass, the pattern configuration and/or the dimension fidelity as a resist may be deteriorated under some process conditions.

Other Component

The photoresist composition (I) may contain, as other optional component, a surfactant, a sensitizing agent, a dye, a pigment, an adhesion accelerator, a halation inhibitor such as 4-hydroxy-4'-methylchalcone, a shape improving agent, a storage stabilizer, a defoaming agent and the like as needed.

Preparation Method of Photoresist Composition

The photoresist composition (I) may be prepared, for example, by mixing the polymer (A), the acid generator (B), other component contained as needed, and the solvent composition (C) in a predetermined ratio, and thereafter filtering the mixture through a filter.

The lower limit of the content of solids of the photoresist composition (I) is 20% by mass, and preferably 25% by mass. The upper limit of the content of solids is 60% by mass, and preferably 55% by mass.

The pore size of a filter used in the filtration is typically no greater than 1.0 μm, and preferably no greater than 0.5 μm. Since the photoresist composition (I) has a low viscosity even in high content of solids, even a filter with a small pore size allows for the filtration without decreasing the production efficiency.

The lower limit of the viscosity of the photoresist composition (I) at 25° C. is preferably 50 mPa·s, and more preferably 60 mPa·s. The upper limit of the viscosity is preferably 150 mPa·s, more preferably 130 mPa·s, still more preferably 110 mPa·s, and particularly preferably 90 mPa·s. When the viscosity falls within the specific range, the rate of filtration and/or the trapping efficiency of unwanted substances may be decreased to a less extent in a production process; moreover, when the photoresist composition (I) is used with a conventional application apparatus for resist compositions for an excimer laser, a necessary flow rate can be ensured more reliably, and the occurrence of foaming is decreased to a greater extent, and as a result, even a film having an increased film thickness of 2 to 20 μm can be uniformly formed.

The photoresist composition (I) is preferably for use in an exposure by way of a KrF excimer laser beam. The photoresist composition (I) can be particularly suitably used in an exposure by way of a KrF excimer laser beam in light of a pattern size and etching resistance.

EXAMPLES

Hereinafter, the present invention will be explained more specifically by way of Examples, but the present invention is not in any way limited by Examples. Measuring methods for various types of physical properties are shown below.

Weight Average Molecular Weight (Mw) and Number Average Molecular Weight (Mn)

The Mw and Mn of the polymer were determined by gel permeation chromatography (GPC) using GPC columns (G2000HXL>2, G3000HXL×1, and G4000HXL×1) manufactured by Tosoh Corporation and monodispersed polystyrene as a standard, under analytical conditions involving: a flow rate of 1.0 mL/min; tetrahydrofuran as an elution solvent; and a column temperature of 40° C.

$^{13}$C-NMR Analysis $^{13}$C-NMR analysis of the polymer was carried out using a nuclear magnetic resonance spectrometer ("JNM-ECX400" manufactured by JEOL, Ltd.).

Synthesis of Polymer (A)

Synthesis Example 1

After 910 g of a compound represented by the following formula (L-1), 358 g of a compound represented by the following formula (L-2), 37 g of a compound represented by the following formula (L-3), 105 g of azobisisobutyronitrile (AIBN) and 55 g of t-dodecyl mercaptan were dissolved in 160 g of propylene glycol monomethyl ether, the polymerization was allowed to proceed for 16 hours under a nitrogen atmosphere while the reaction temperature of 70° C. was maintained. After the completion of the polymerization, the reaction solution was added dropwise to a large amount of n-hexane to solidify and purify the resulting polymer. Next, to the polymer obtained after the purification was added 1,500 g of propylene glycol monomethyl ether again, then further 3,000 g of methanol, 800 g of triethylamine and 150 g of water were added, and the hydrolysis reaction was allowed to proceed for 8 hours, while refluxing at a boiling point. After the completion of the reaction, the solvent and triethylamine were distilled off under vacuum. The obtained polymer was dissolved in acetone, then the solution was added dropwise to a large amount of water to solidify the polymer, and the resulting white powder was filtered and dried overnight at 50° C. under a reduced pressure to obtain a polymer (A-1). The obtained polymer (A-1) had an Mw of 4,500 and an Mw/Mn of 1.8. Moreover, the result of the $^{13}$C-NMR analysis indicated that the polymer had each structural unit represented by the following formula (A-1) and the proportions (mol %) of structural units a, b and c were 70.1, 25.4 and 4.5, respectively.

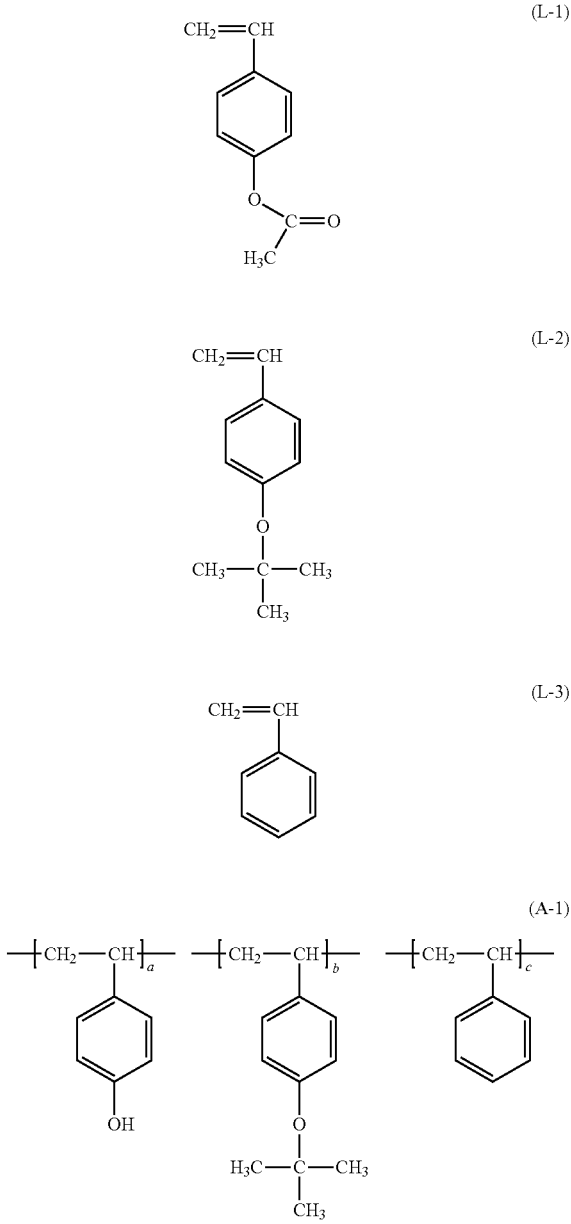

Synthesis Example 2

After 920 g of the compound represented by the above formula (L-1), 345 g of the compound represented by the above formula (L-2), 40 g of the compound represented by the above formula (L-3), 105 g of azobisisobutyronitrile (AIBN) and 30 g of t-dodecyl mercaptan were dissolved in 1,600 g of propylene glycol monomethyl ether, the polymerization was allowed to proceed for 16 hours under a nitrogen atmosphere while the reaction temperature of 70° C. was maintained. After the completion of the polymerization, the reaction solution was added dropwise to a large amount of n-hexane to solidify and purify the resulting polymer. Next, to the polymer obtained after the purification was added 1,500 g of propylene glycol monomethyl ether again, then further 3,000 g of methanol, 800 g of triethylamine and 150 g of water were added, and the hydrolysis reaction was allowed to proceed for 8 hours, while refluxing at a boiling point. After the completion of the reaction, the solvent and triethylamine were distilled off under vacuum. The obtained polymer was dissolved in acetone, then the solution was added dropwise to a large amount of water to solidify the polymer, and the resulting white powder was filtered and dried overnight at 50° C. under a reduced pressure to obtain a polymer (A-2). The obtained polymer (A-2) had an Mw of 6,700 and an Mw/Mn of 1.7. Moreover, the result of the $^{13}$C-NMR analysis indicated that the polymer had each structural unit represented by the above formula (A-1) and the proportions (mol %) of structural units a, b and c were 70.8, 24.5 and 4.7, respectively.

Synthesis Example 3

After 940 g of the compound represented by the above formula (L-1), 325 g of the compound represented by the above formula (L-2), 40 g of the compound represented by the above formula (L-3), 79 g of azobisisobutyronitrile (AIBN) and 10 g of t-dodecyl mercaptan were dissolved in 1,600 g of propylene glycol monomethyl ether, the polymerization was allowed to proceed for 16 hours under a nitrogen atmosphere while the reaction temperature of 70° C. was maintained. After the completion of the polymerization, the reaction solution was added dropwise to a large amount of n-hexane to solidify and purify the resulting polymer. Next, to the polymer obtained after the purification was added 1,500 g of propylene glycol monomethyl ether again, then further 3,000 g of methanol, 800 g of triethylamine and 150 g of water were added, and the hydrolysis reaction was allowed to proceed for 8 hours, while refluxing at a boiling point. After the completion of the reaction, the solvent and triethylamine were distilled off under vacuum. The obtained polymer was dissolved in acetone, then the solution was added dropwise to a large amount of water to solidify the polymer, and the resulting white powder was filtered and dried overnight at 50° C. under a reduced pressure to obtain a polymer (A-3). The obtained polymer (A-3) had an Mw of 12,000 and an Mw/Mn of 1.7. Moreover, the result of the $^{13}$C-NMR analysis indicated that the polymer had each structural unit represented by the above formula (A-1) and the proportions (mol %) of structural units a, b and c were 72.2, 23.1 and 4.7, respectively.

Synthesis Example 4

After 480 g of poly(p-hydroxystyrene) (Mw 4,500) was dissolved in 2,000 g of dioxane, bubbling with a nitrogen gas was carried out for 30 min. To the solution were added 160 g of ethyl vinyl ether and 20 g of p-toluenesulfonic acid pyridinium salt as a catalyst, and the reaction was allowed to proceed for 12 hours. The reaction solution was added dropwise to a 1% by mass aqueous ammonia solution to precipitate a polymer. The polymer was dried overnight in a vacuum dryer at 50° C. to obtain a polymer (A-4). The obtained polymer (A-4) had an Mw of 4,500 and an Mw/Mn of 1.6. Moreover, the result of the $^{13}$C-NMR analysis indicated that the polymer had each structural unit represented by the following formula (A-4) and the proportions (mol %) of structural units a and d were 54.5 and 45.5, respectively.

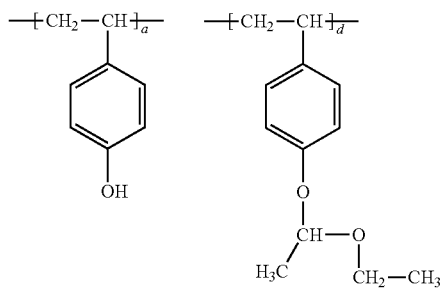

(A-4)

Synthesis Example 5

After 940 g of the compound represented by the following formula (L-1), 608 g of a compound represented by the following formula (L-4), 130 g of azobisisobutyronitrile (AIBN) and 13 g of t-dodecyl mercaptan were dissolved in 1,550 g of propylene glycol monomethyl ether, the polymerization was allowed to proceed under a nitrogen atmosphere while the reaction temperature was maintained at 70° C. for 3 hours, then at 75° C. for 3 hours, and then at 95° C. for 1 hour. After the completion of the polymerization, the reaction solution was added dropwise to a large amount of n-hexane to solidify and purify the resulting polymer. Next, to the polymer obtained after the purification was added 1,200 g of propylene glycol monomethyl ether again, then further 1,200 g of methanol, 230 g of triethylamine and 40 g of water were added, and the hydrolysis reaction was allowed to proceed at 70° C. for 7 hours. After the completion of the reaction, the solvent and triethylamine were distilled off under vacuum. The obtained polymer was dissolved in acetone, then the solution was added dropwise to a large amount of water to solidify the polymer, and the resulting white powder was filtered and dried overnight at 50° C. under a reduced pressure to obtain a polymer (A-5). The obtained polymer (A-5) had an Mw of 13,500 and an Mw/Mn of 2.4. Moreover, the result of the $^{13}$C-NMR analysis indicated that the polymer had each structural unit represented by the following formula (A-5) and the proportions (mol %) of structural units a and e were 55.3 and 44.7, respectively.

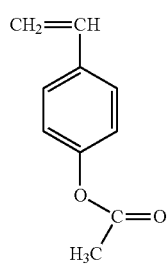

(L-1)

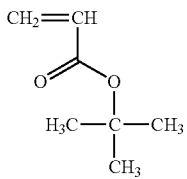

(L-4)

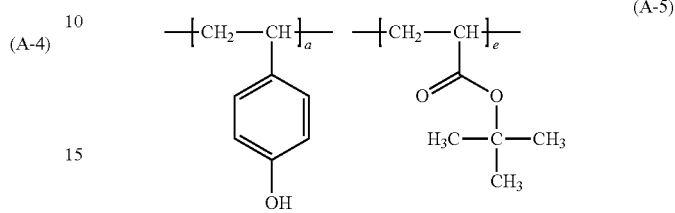

(A-5)

Preparation of Photoresist Composition

Each component other than the polymer (A) used in the preparation of the photoresist composition is shown below.

(B) Acid Generating Agent

B-1: N-(trifluoromethanesulfonyloxy)bicyclo[2.2.1]hept-5-ene-2,3-dicarboximide

B-2: triphenylsulfonium trifluoromethanesulfonate

B-3: N-(5-methyl-5-carboxymethylbicyclo[2.2.1]heptan-2-yl)sulfonyloxysuccinimide (C) Solvent Composition (C1) Solvent C1-1: propylene glycol monomethyl ether acetate (viscosity at 20° C.: 1.3 mPa·s)

C1-2: methyl 3-methoxypropionate (viscosity at 20° C.: 1.1 mPa·s)

C1-3: 2-heptanone (viscosity at 20° C.: 0.77 mPa·s)

C1-4: n-butyl acetate (viscosity at 20° C.: 0.74 mPa·s)

(C2) Solvent

C2-1: ethyl lactate (viscosity at 20° C.: 2.6 mPa·s)

(D) Acid Diffusion Control Agent

D-1: 2-phenylbenzimidazole

Example 1

A photoresist composition (J-1) was prepared by mixing 100 parts by mass of (A-1) as the polymer (A), 6 parts by mass of (B-1) as the acid generating agent (B), 178 parts by mass of (C1-1) as the solvent (C1) of the solvent composition (C) and 0.4 parts by mass of (D-1) as the acid diffusion control agent (D) to obtain a homogenous solution, followed by filtration through a membrane filter made of Teflon (registered trademark) ("Titan3" manufactured by SUN-SRi, pore size 1.0 µm).

Examples 2 to 12 and Comparative Examples 1 to 2

Photoresist compositions (J-2) to (J-12) and (CJ-1) to (CJ-2) were prepared in a similar manner to Example 1 except that each component the type and the content of which were as shown in Table 1 below was used.

TABLE 1

| | Photoresist composition | (A) Polymer type | content (parts by mass) | (B) Acid generating agent type | content (parts by mass) | (C) Solvent composition type | content (parts by mass) | (D) Acid diffusion control agent type | content (parts by mass) |
|---|---|---|---|---|---|---|---|---|---|
| Example 1 | J-1 | A-1 | 100 | B-1 | 6 | C1-1 | 178 | D-1 | 0.4 |
| Example 2 | J-2 | A-1 | 100 | B-1 | 6 | C1-2 | 132 | D-1 | 0.4 |
| Example 3 | J-3 | A-1 | 100 | B-1 | 6 | C1-3 | 108 | D-1 | 0.4 |
| Example 4 | J-4 | A-1 | 100 | B-1 | 6 | C1-1/C1-2 | 80/80 | D-1 | 0.4 |
| Example 5 | J-5 | A-1 | 100 | B-1 | 6 | C1-1/C1-3 | 68/68 | D-1 | 0.4 |
| Example 6 | J-6 | A-1 | 100 | B-1 | 6 | C1-1/C1-4 | 77/77 | D-1 | 0.4 |
| Example 7 | J-7 | A-1 | 100 | B-1 | 6 | C1-1/C2-1 | 128/55 | D-1 | 0.4 |
| Example 8 | J-8 | A-2 | 100 | B-1 | 6 | C1-1 | 212 | D-1 | 0.4 |
| Example 9 | J-9 | A-4 | 100 | B-1 | 6 | C1-1 | 170 | D-1 | 0.4 |
| Example 10 | J-10 | A-1/A-5 | 80/20 | B-1 | 6 | C1-1/C1-4 | 136/34 | D-1 | 0.4 |
| Example 11 | J-11 | A-1/A-5 | 80/20 | B-2 | 6 | C1-1/C1-4 | 136/34 | D-1 | 0.4 |
| Example 12 | J-12 | A-1/A-5 | 80/20 | B-2/B-3 | 3/3 | C1-1/C1-4 | 136/34 | D-1 | 0.4 |
| Comparative Example 1 | CJ-1 | A-3 | 100 | B-1 | 6 | C1-1 | 238 | D-1 | 0.4 |
| Comparative Example 2 | CJ-2 | A-1 | 100 | B-1 | 6 | C1-1 | 954 | D-1 | 0.4 |

Formation of Resist Film

Each photoresist composition as prepared above was spin-coated on a silicon wafer at 1,100 rpm, followed by PB at 110° C. for 60 sec, to form a resist film.

Evaluations

The prepared photoresist composition and the formed resist film were evaluated in accordance with the following methods. The results of the evaluations are shown in Table 2.

Resist Film Thickness

The resist film thickness was measured using a spectroscopic film thickness measurement system ("VM-2010" manufactured by Dainippon Screen Mfg. Co., Ltd.) (unit of the film thickness: μm).

Viscosity

The viscosity of a composition identical to the photoresist composition used in the measurement of the resist film thickness was measured using an E-type viscometer ("RE-80L" manufactured by Toki Sangyo Co., Ltd) under a condition involving 25° C. and 4 rpm (unit of the viscosity: mPa·s).

Filtration Flow Rate

After 1 kg of the photoresist composition was circulated for 6 hours for filtration through a polyethylene filter with a pore size of 0.5 μm ("CWUH0S1S3" manufactured by Nihon Entegris K.K.) at a filtration pressure of 0.12 MPa at a temperature of 23° C., the solution amount of the photoresist composition discharged through an identical filter at an identical filtration pressure for 1 min was determined and designated as a filtration flow rate (mL/min). It is to be noted that a chemical pump ("DP-5F" manufactured by Yamada Corporation) was used as a compression pump.

Unwanted Substances

The photoresist composition obtained in connection with the determination of the filtration flow rate was subjected to a determination using a particle sensor ("KS-40B" manufactured by RION Co., LTD.).

In a case where the number of unwanted substances with a size of no less than 0.2 μm contained per mL of the photoresist composition was less than 100, the photoresist composition was evaluated to be "favorable", whereas in a case where the number of the unwanted substances per mL of the photoresist composition was no less than 100, the photoresist composition was evaluated to be "unfavorable".

TABLE 2

| | Photoresist composition | Film thickness (μm) | Viscosity (mPa·s) | Filtration flow rate (mL/min) | Unwanted substances |
|---|---|---|---|---|---|
| Example 1 | J-1 | 7.5 | 100 | 90 | favorable |
| Example 2 | J-2 | 7.5 | 80 | 98 | favorable |
| Example 3 | J-3 | 7.5 | 68 | 104 | favorable |
| Example 4 | J-4 | 7.5 | 89 | 94 | favorable |
| Example 5 | J-5 | 7.5 | 81 | 98 | favorable |
| Example 6 | J-6 | 7.5 | 75 | 101 | favorable |
| Example 7 | J-7 | 7.5 | 140 | 71 | favorable |
| Example 8 | J-8 | 7.5 | 145 | 59 | favorable |
| Example 9 | J-9 | 7.5 | 83 | 93 | favorable |
| Example 10 | J-10 | 7.5 | 83 | 93 | favorable |
| Example 11 | J-11 | 7.5 | 83 | 93 | favorable |
| Example 12 | J-12 | 7.5 | 83 | 93 | favorable |
| Comparative Example 1 | CJ-1 | 7.5 | 220 | — | unfavorable |
| Comparative Example 2 | CJ-2 | 1.4 | 20 | 300 | favorable |

As can be seen from the results shown in Table 2, in the resist pattern-forming method according to Examples, a proper viscosity can be attained and the filtration flow rate can be increased, resulting in the formation of a resist film having an increased film thickness while reducing the number of the unwanted substances. It is to be noted that in Comparative Example 1, the photoresist composition had a high viscosity due to the high content of solids thereof and the filtration failed.

INDUSTRIAL APPLICABILITY

According to the resist pattern-forming method and the photoresist composition of the present invention, resist performances can be improved, and a resist pattern having an increased film thickness can be formed using a preexisting application apparatus without decreasing productivity thereof. According to the substrate-processing method of the present invention, a substrate can be easily and favorably processed to form a three-dimensional structure.

The invention claimed is:
1. A photoresist composition, comprising:
a polymer comprising:
a structural unit comprising an acid-labile group that is dissociated by an action of an acid and represented by formula (1-4); and
a structural unit represented by formula (1-1);
a radiation-sensitive acid generator; and
a solvent composition comprising a first solvent which comprises an alkylene glycol monoalkyl ether acetate and has a viscosity of no greater than 1.5 mPa·s at 20° C., a content of the first solvent in the total solvent composition being no less than 60% by mass,
the polymer having a weight average molecular weight of no less than 1,000 and no greater than 7,500,
the photoresist composition having a content of solids of no less than 20% by mass and no greater than 60% by mass,

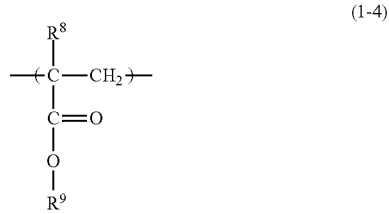

wherein in the formula (1-4):
$R^8$ represents a hydrogen atom or a methyl group; and
$R^9$ represents a monovalent acid-labile group,

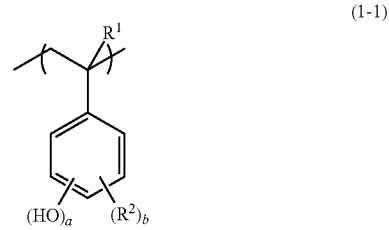

wherein in the formula (1-1):
$R^1$ represents a hydrogen atom or an alkyl group having 1 to 5 carbon atoms;
$R^2$ represents a substituted or unsubstituted alkyl group having 1 to 12 carbon atoms, a substituted or unsubstituted alkoxy group having 1 to 12 carbon atoms, or a substituted or unsubstituted monovalent aromatic hydrocarbon group having 6 to 12 carbon atoms;
a is an integer of 1 to 3; and
b is an integer of 0 to 3, wherein a sum of a and b is no greater than 5, and wherein in a case where b is no less than 2, a plurality of $R^2$s are identical or different.
2. The photoresist composition according to claim 1, wherein the photoresist composition has a viscosity of no less than 50 mPa·s and no greater than 150 mPa·s at 25 ° C.
3. The photoresist composition according to claim 1, wherein the first solvent further comprises an additional ester compound, a linear ketone compound or a combination thereof, wherein the additional ester compound is at least one selected from the group consisting of methyl acetate, ethyl acetate, n-propyl acetate, i-propyl acetate, n-butyl acetate, i-butyl acetate, n-amyl acetate, i-amyl acetate, ethyl propionate, n-butyl propionate, i-amyl propionate, ethyl methoxyacetate, ethyl ethoxyacetate, methyl 3-methoxypropionate, ethyl 3-methoxypropionate, methyl 3-ethoxypropionate, ethyl 3-ethoxypropionate and methyl acetoacetate.
4. The photoresist composition according to claim 1, wherein the solvent composition further comprises a second solvent comprising a compound that comprises a hydroxy group, a cyclic ketone compound or a combination thereof.
5. The photoresist composition according to claim 1, wherein a content of the polymer in the photoresist composition with respect to total solid components of the photoresist composition is no less than 70% by mass.
6. The photoresist composition according to claim 1, wherein the weight average molecular weight of the polymer is no less than 3,000 and no greater than 7,000.
7. The photoresist composition according to claim 1, wherein a proportion of the structural unit represented by the formula (1-1) with respect to the total structural units constituting the polymer is no less than 20 mol % and no greater than 90 mol %.
8. The photoresist composition according to claim 1, wherein a proportion of the structural unit represented by the formula (1-1) with respect to the total structural units constituting the polymer is no less than 40 mol % and no greater than 80 mol %.
9. The photoresist composition according to claim 1, wherein a proportion of the structural unit represented by the formula (1-4) with respect to the total structural units constituting the polymer is no less than 10 mol % and no greater than 50 mol %.
10. The photoresist composition according to claim 1, further comprising an acid diffusion controller.
11. The photoresist composition according to claim 1, wherein the polymer further comprises a structural unit represented by formula (1-3):

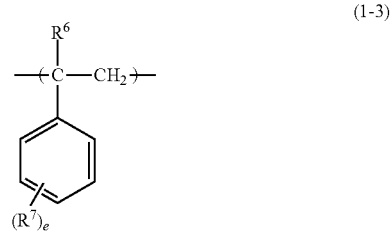

wherein, in the above formula (1-3), $R^6$ represents a hydrogen atom or a methyl group; $R^7$ represents a monovalent hydrocarbon group or a non-acid-dissociable monovalent oxyhydrocarbon group; and e is an integer of 0 to 3, wherein in a case where e is no less than 2, a plurality of $R^7$s are identical or different.
12. The photoresist composition according to claim 11, wherein a proportion of the structural unit represented by the formula (1-3) with respect to the total structural units constituting the polymer is and no greater than 20 mol %.
13. The photoresist composition according to claim 1, wherein the first solvent further comprises at least one selected from the group consisting of an aliphatic carboxylic acid ester and a linear ketone compound.

* * * * *